United States Patent

[11] 3,540,718

[72] Inventors Robert E. Heffron,
550 N. Horn;
Russell W. Meredith, 405 E. 10th St.,
both of Mesa, Arizona 85201
[21] Appl. No. 574,111
[22] Filed Aug. 22, 1966
[45] Patented Nov. 17, 1970

[54] PRINTED CIRCUIT BOARD COMPONENT CLAMP AND ASSEMBLY JIG
1 Claim, 3 Drawing Figs.

[52] U.S. Cl. .......... 269/254, 269/275, 269/287; 29/626; 206/46
[51] Int. Cl. .......... B23k 37/04; H05k 3/34
[50] Field of Search .......... 269/154, 254, 275, 287, 288; 5/345; 29/626, 627, 203B; 297/(foam); 206/46FCM, 65F

[56] References Cited
UNITED STATES PATENTS
2,329,867 9/1943 Whitehead .......... 269/254
2,490,111 12/1949 Whitehead .......... 269/254X
3,191,197 6/1965 Frey .......... 297/(foam)
3,395,439 8/1968 Palesi et al. .......... 29/203(B)
FOREIGN PATENTS
1,450,116 7/1966 France .......... 51/395
1,200,204 9/1965 Germany .......... 206/46(F.C.M.)UX

*Primary Examiner*—Lester M. Swingle
*Attorney*—Drummond, Cahill & Phillips

ABSTRACT: A printed circuit board component clamp and assembly jig adapted to hold a printed circuit board in juxtaposition, and means for holding compressive board against components on a printed circuitry board during the trimming of the leads and the soldering thereof; the compressive elements of the jig comprising resilient material formed into a plurality of contiguous deflectable fingers adapted to deflect independently and individually to engage and compressively hold various components on said printed circuitry board as it is held in juxtaposition by said jig.

Patented Nov. 17, 1970 3,540,718

Figures 1, 2:
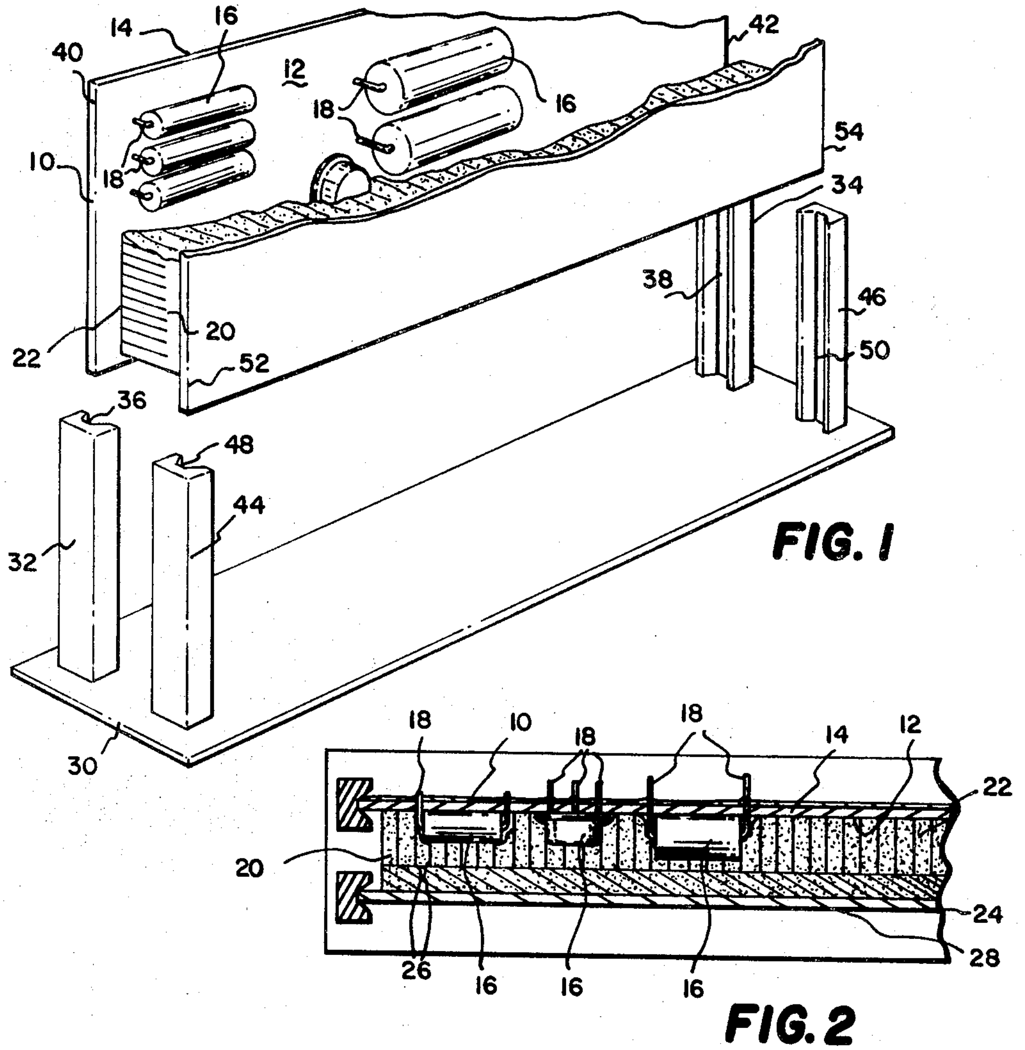

INVENTOR.
ROBERT E. HEFFRON
RUSSELL W. MEREDITH
BY
Wm. H. Dean

PRINTED CIRCUIT BOARD COMPONENT CLAMP AND ASSEMBLY JIG

This invention relates to a printed circuit board component clamp and assembly jig and, more particularly, to a printed circuit board component clamp and assembly jig which greatly facilitates the assembly of circuit components on printed circuit boards preliminary to the trimming of the component leads and the soldering of such leads into circuits with the printed circuit on the board.

Prior art methods of assembling circuit components on a printed circuit board have been quite costly in labor and relative to errors created or caused by numerous operations which have been carried out separately and/or consecutively bad. The conventional prior art methods used in the assembly of circuit components on printed circuit boards is substantially as follows:

Usually each component is selected from a parts bin or drawer and the component leads or wires and connections therewith are bent manually at substantially a 90° angle in order that these leads may be inserted from the back of the board through holes to the printed circuit side and in position to be soldered to the printed circuitry. After the insertion of the leads in the boards, the board is turned by hand to permit spreading of the protruding component leads or wires to thereby clamp the component to the board. In many instances two or more separate components are inserted and clamped in this manner before the protruding leads begin to interfere with further assembly steps. After several of these leads have been bent laterally to lock the leads and the respective components in place the leads project angularly across the printed circuitry, and therefore interfere with each other and necessitate the snipping of these leads before additional components may be inserted and locked in place. This has been a major problem in such assembly work. Mainly the locking of the components in connection with the boards so that they may be integrated in the circuitry, mainly by soldering the leads to the printed circuitry. Thus the prior art methods have permitted only a limited number of the components to be put in place before the soldering operations continue. This has caused the necessity of repeating the insertion of a component or two, the anchoring or bending of the leads, then the snipping of the leads, and then the soldering of a few of these leads in place. This conventional process is repeated with one or two components at a time until the circuit board has been fully assembled. Conventional practice in the assembly of components in this manner on a printed circuitry board is to mount the small components first and to progress toward the installation of the larger and bulkier components such as board mounted relays I.F. cans and etc. The circuit boards thus assembled require the handling of the entire board and component at least two times for each mounting operation. The person assembling such components on a circuit board tends to lose track of the relationship of the parts and their integration into the circuit each time the board is turned. Thus, orientation of the board and the relative position of components becomes confused momentarily and the operator oftentimes makes mistakes which are very costly. This happens to the most skilled technicians who have assembled many circuit boards and such errors often result in expensive trouble shooting or component destruction. Additional disadvantages of the present prior art methods are as follows:

It is impossible to achieve production assembly rhythm which results in variations in the components alignment, the solder joints are made at a great variety of angles due to the angular bending of the leads against the printed circuit side of the board, and this also results in the lateral flow of solder which sometimes tends to abridge circuitry and short the printed circuit board. In mass production, extremely complicated component insertion equipment and complex automatic soldering equipment must be maintained, and each automatic operation so devised must be especially set up for each individual circuit component board assembly operation. However, such expensive equipment cannot be afforded for medium volume production or laboratory assembly and further the electronics kit manufacturers have found a great need for a simple means for assemblying such circuit boards and components so that a great number of these kits sold to the general public might be more efficiently and successfully assembled. Additionally it has been the problem to provide a means for assemblying circuit boards and components where short production runs must be attained, even among many organizations specializing in the manufacture of circuit board electronics apparatus.

Accordingly it is the object of the present invention to provide a very simple and economical printed circuit board component clamp and assembly jig which readily facilitates and economizes relative to the assembly of components on printed circuit boards or which makes possible efficient limited production of such apparatus.

Another object of the invention is to provide a very novel printed circuit board component clamp and assembly jig wherein a sliced compressible pad is held in compressive relation with the component side of a circuit board such that all of the components, large and small, are compressibly held against the back side of a printed circuit board with their leads all protruding through the board to the printed circuit side; thereby, permitting all the leads to extend straight through the board and straightaway from the printed circuitry to permit uniform snipping and soldering of all of these leads or wires from the components in a single operation to maintain uniformity of projection of the wires or leads through the printed circuitry as well as the following soldering operation and the solder around the leads and on the printed circuitry.

Another object of the invention is to provide a printed circuit board component clamp and assembly jig wherein a compressible pad is sliced apart in a gridlike form such that a great plurality of individual sliced apart contiguous sections are independently compressible in order to provide a sharp delineation of compressibility between large components on the board and small components on the board, such that each component is uniformly engaged throughout its cross-sectional area to the extent that all components may be assembled on the board by projecting the leads downwardly through the board, with the back of the board facing upward and then the diced sections of the compressible pad may be placed on all of the components at once and clamped thereagainst, holding these components in place for subsequent uniform lead snipping and soldering operation. All of which provides production line assembly efficiency, as well as neatness of alignment of the components and their leads and of the soldering operation, and also the elimination of errors due to loss of orientation of the assembly operator.

Another object of the invention is to provide a printed circuit board component clamp assembly and jig, which may be used efficiently in short production runs, or for the assembly of kits, or for laboratory assembly work related to the printed circuit boards and components being integrated therewith.

Figure 3:
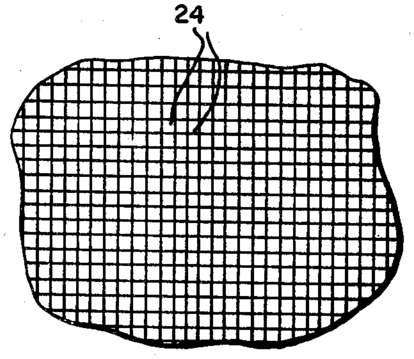

Further objects and advantages of the invention may be apparent in the following specification, appended claims and accompanying drawings, in which:

FIG. 1 is a perspective view of the rear side of a printed circuit board, showing circuit components with their leads extending through the board, and showing the sliced apart resilient pad of the invention holding these components compressively against the rear side of the board, and showing a jig for holding the circuit board, as well as a backup board for the resilient pad of the invention, so as to retain the compressed portions of the pad in intimate engagement with the components on the back of the board, for holding them in juxtaposition, while the leads projecting through the opposite side of the board from the components may be accurately and efficiently snipped and aligned and soldered, all in a production like manner; said disclosure of FIG. 1 illustrating the printed circuit board and the backup board for the resilient pad in exploded relation with the assembly jig for purposes of clarity. FIG. 1 also illustrating parts and portions fragmentarily to amplify the illustration;

FIG. 2 is a fragmentary plan sectional view taken through the structure, shown in FIG. 1, showing the printed circuit board and the resilient pad backup board held in spaced relationship to each other at opposite sides of the compressive pad of the invention, and holding the compressive pad in compressive relationship to with components on the back of the printed circuit board, and showing the leads of the circuit components projecting through the board to the printed side thereof, and projecting in position to be snipped preliminary to soldering;

FIG. 3 is a side elevational view of the compressive pad of the invention, showing the sliced apart sections thereof, which are adapted compressively to engage components on a printed circuit board and to independently deflect to provide uniform engagement of the components large and small on the back side of the printed circuit board.

As shown in FIGS. 1 and 2, a conventional printed circuit board 10, is provided with a rear side 12, and a printed circuit side 14. Such circuit boards 10 are adapted to support a variety of electronic components 16 on the rear side 12. These components 16 having wire leads 18, which project from the rear side 12 through the boards and through the printed circuitry 14. The resilient compressible pad of the invention is designated 20, and may consist of foam rubber or other suitable material, which is resiliently compressible. This pad, on its component engaging surface 22 is sliced apart so as to provide a grid of diced sections 24, as shown in FIG. 3 of the drawings. The depth of the slicing cuts may be substantially two-thirds of the distance from the surface 22 to a rear surface 24, as shown in FIG. 2 of the drawings. These cuts being designated 26 such as to provide a gridwork of independently deflectable foam sections or fingers directed toward the components 16 and engaging them in compressive relationship, such that all of the independently deflectable fingers or slice apart sections may engage large components and adjacent small components without creating large deflected depressions by the large components, and thus the small components placed close to the large components are efficiently and compressively engaged by the independently deflectable fingers or diced sections and thereby permitting the assembly of a good variety of sizes and shapes of components on a circuit board in adjacent relation to each other, and permitting all of them to be efficiently and compressively engaged by the compressive fingers for holding these components securely against the back side 12 of the printed circuit board 10 so that the leads 18 projecting through the board may be straight and so that all of the components may be inserted and secured to the board and held compressively there against, as will be hereinafter described.

The backup board 28 then engages the rear side of the compressive pad 20 of the invention and board 28 may be compressed against the printed circuit board 10 so as to hold the compressive pad 20 securely against the components during snipping of the leads and soldering. This is accomplished by a jig 30 having a pair of channel members 32 and 34 provided with channel locks 36 and 38 in which opposite end edges 40 and 42 of the printed circuit board 10 may be engaged as shown best in FIGS. 1 and 2 of the drawings. Likewise a pair of channel members 44 and 46 are provided with channel portions 48 and 50 which receive and engage opposite edges 52 and 54 of the backup board 28. The slots 36 and 38 being spaced from the slots 48 and 50 so as to hold the pad 20 in compression between the board 28 and the components 16 and the back 12 of the printed circuit board 10. Thus when the boards 10 and 28 are inserted in the channel members 32, 34, 44 and 46 respectively, the boards are compressed together and slidably moved downward into the channel, whereupon the compressive pad 22 is placed in compression, such that the independent sliced apart sections or compressible fingers uniformly support all of the components large and small with their leads 18 projecting straightaway or normal to the printed circuitry 14 on the board form. The operator may then snip all of the leads or wires 18 in close proximity to the printed circuit 14 on leaving these ends directed normal to the surface of the printed circuitry 14, so that soldering operations may be neat and uniformly accomplished all at the same time without resorting to the alternate turning of the boards for each individual soldering operation on one or two components at a time.

It will be apparent to those skilled in the art that various modifications of the present invention may be resorted to in a manner limited only by a just interpretation of the following claims.

We claim:

1. An apparatus for clamping components to a printed circuit board comprising: a pad made of resilient material and having a plurality of substantially contiguous independently deflectable fingers projecting from one side thereof, said fingers being adapted to engage and exert pressure in a direction normal to the printed circuit board on components disposed on the rear side of the printed circuit board; backing means for engaging the side of said pad opposite said one side; and holding means for holding said pad and said backing means in compressive relationship with the components on the printed circuit board; said holding means comprising a jig, said jig comprising first channel means adapted to engage opposite edges of the printed circuit board, and second channel means for holding opposite edges of said backing means, said second channel means being spaced from said first channel means sufficiently so that said pad is held in compressive relation between said backing means and the components on said printed circuit board.